United States Patent [19]

White

[11] Patent Number: 4,923,301

[45] Date of Patent: May 8, 1990

[54] ALIGNMENT OF LITHOGRAPHIC SYSTEM

[75] Inventor: Donald L. White, Springfield, N.J.

[73] Assignee: American Telephone and Telegraph Company, New York, N.Y.

[21] Appl. No.: 199,106

[22] Filed: May 26, 1988

[51] Int. Cl.$^5$ .............................................. G01B 9/02
[52] U.S. Cl. .................................... 356/356; 356/363
[58] Field of Search ................................ 356/356, 363

[56] References Cited

U.S. PATENT DOCUMENTS 4,402,610 9/1983 Lacombat ...................... 356/363 X
4,631,416 12/1986 Trutna, Jr. ..................... 356/356 X

OTHER PUBLICATIONS

*VLSI Electronics*, N. Einspruch, ed., p. 320, Academic Press, 1987.

Primary Examiner—Davis L. Willis
Assistant Examiner—Matthew W. Koren
Attorney, Agent, or Firm—Bruce S. Schneider

[57] ABSTRACT

A method for lithographic alignment utilized in the manufacture of integrated circuits is described. The procedure includes an initial calibration through the lens system to expose a calibration material in a diffraction grating pattern. An interference pattern is produced above the grating with intersecting laser beams. By adjusting the path and/or phase of these beams the interference pattern is aligned with the diffraction pattern to establish a calibration point corresponding to a reference intensity in the intensity of the diffracted light. A wafer to be exposed is then placed in the exposure tool and is aligned by observing the diffraction pattern from a diffraction grating fiducial mark induced by the calibrated interference pattern.

20 Claims, 2 Drawing Sheets

ALIGNMENT OF LITHOGRAPHIC SYSTEM

TECHNICAL FIELD

This invention relates to the fabrication of devices, and in particular, the fabrication of devices requiring the registration of lithographic patterns.

ART BACKGROUND

In the manufacture of devices such as integrated circuits, a pattern is produced through lithograhic processes in a radiation-sensitive material coated on a device substrate. (Substrate, for purposes of this disclosure, is a body, e.g., a semiconductor body, that is being processed into a device or plurality of devices, e.g., semiconductor devices. This body could include not only semiconductor materials or optoelectronic materials, but also regions of organic materials, metals, and/or dielectrics.) These processes generally involve a series of exposures over the radiation-sensitive material, e.g., a resist, in a desired repeated pattern by light projected through a mask or reticle and focused onto the photosensitive material with a suitable lens system. However, the substrate before each exposure must be positioned relative to the projected pattern (generally by use of a translation stage, controlled by a position measuring device such as an interferometer) so an appropriate spatial alignment is obtained between the projected image and device patterns on the wafer.

One method of alignment is a global technique. In this procedure to calibrate the system a sample wafer having appropriately positioned alignment mark(s) underlying a radiation-sensitive layer is, for calibration, moved into the viewing field of a microscope, 31 FIG. 1, external to the exposure lens system. The substrate alignment marks are aligned with the reference fiducial mark(s) of the microscope. The substrate is then moved to the exposure position under interferometric control. The distance of movement is calculated from the known position of the microscope fiducial mark and from the desired position of exposure.

The substrate is then exposed utilizing the reticle to be employed in the device fabrication. The reticle pattern includes an alignment mark (generally a vernier series of marks) that is projected onto the radiation-sensitive material. The radiation-sensitive material is developed and the spatial separation of the projected alignment mark relative to the wafer alignment mark, i.e., the spatial error, is determined by optical inspection. After calibration, for device production, the device substrate being processed is initially aligned using the microscope fiducial marks. The substrate is then positioned for exposure by, for example, interferometry employing a suitable correction for all positioning as previously determined by the global calibration. Subsequent, positioning is done by dead reckoning from one exposure position to the next on the substrate.

The relative large dead reckoning translations associated with the global alignment technique introduces a concomitant error. In a second approach denominated a site-by-site technique, a separate alignment measurement is performed for each exposure on a wafer during production, and thus, less error is typically introduced. In this technique there is an alignment mark(s) on the wafer for each fabrication exposure to be performed. Before each fabrication exposure there is an alignment at the corresponding alignment mark and then movement from the alignment position a known, relatively short, distance to the fabrication exposure position.

A more desirable approach for a site-by-site alignment procedure would use the exposing wavelength to project a fiducial mark on the mask or reticle through the imaging lens with alignment accomplished between this projection and a corresponding mark on the substrate without the necessity of moving the substrate between alignment and fabrication exposure. In this manner, it would be possible to eliminate errors associated with (1) wafer movement and with (2) assumptions based on both the indirect measurement of distance and on the equivalence of different lens systems to different wavelengths. In practice it is difficult to employ this desired approach. It is usually undesirable to employ the exposing wavelength for alignment because the radiation-sensitive material on the substrate generally is irreversibly modified in the region of the alignment marks (fiducial marks). This premature exposure is undesirable because the alignment mark necessary for subsequent alignment in the next device layer is often obliterated. Additionally, deep ultraviolet light is often strongly absorbed by the photosensitive material, and thus, does not illuminate the mark on the wafer.

Since it is generally not desirable to use light of the exposing wavelength for alignment, the use of the exposure lens system is also often precluded and alignment is done at a place removed from the exposure position even in systems that align through the exposure lens. (This limitation is especially severe for deep ultraviolet exposure systems--systems operating with light in the wavelength range 350 to 180 nm.) The exposure lens system is designed for the wavelength of the exposing light, and thus, causes optical distortions when used with a different wavelength. The greater the differrence in wavelength between the aligning and exposing light, the greater the distortion. Generally, longer wavelength light (light in the wavelength range 5000 to 11,000 Angstroms) is used for alignment to avoid exposure of the resist material. Such light, e.g., red light from the HeNe laser, is so far removed from the deep ultraviolet region of the spectrum that gross distortions would occur if the exposing lens system is utilized for alignment. Additionally, the anti-reflection coatings on the exposure lenses often produce large reflections at wavelengths other than the exposure wavelength. Some site-by-site systems compensate for these effects by placing special but small optical elements in the exposure lens. These elements are usually located at the edge of the exposure field where they do not interfere with normal operation. However, for stability, these elements are fixed in position, and to be aligned the alignment mark on a wafer must be moved under these elements and away from the exposure position.

For these reasons, site-by-site alignment is generally done with the device substrate positioned on the edge of the lens system, either outside the lens barrel as shown in phantom at 60 in FIG. 1 or at the very edge of the exposure field, to allow non-distorted introduction of the aligning light. Reflection is observed with a monitor, e.g., a television camera or the microscope. The optical axis or other known fiducial mark position of the microscope is calibrated relative to a point of reference. The reticle fiducial mark is calibrated relative to the same point of reference. The stage is then moved to alignment using interferometric techniques a calculated distance based on the two calibration measurements and optical alignment measurement. Clearly, numerous errors are possible in calibration, measurement, and movement. Thus, although alignment techniques have been satisfactory for presently used wavelengths (the blue and near ultraviolet wavelengths) and/or for design rules of 0.9 μm and larger, improvement is certainly possible. Additionally, for deep ultraviolet lithographic systems serious difficulties and unresolved impediments are presented.

SUMMARY OF THE INVENTION

The inventive procedure for an exposure system, such as a deep ultraviolet exposure system, allows calibration and alignment using the exposing wavelength with alignment occurring in the exposure position. This alignment is preferably performed by using an initial calibration with the exposing light through the exposure lens system and a subsequent direct optical alignment. Thus, through this specific division of steps all the desired expedients are employed to provide excellent alignment accuracy.

The calibration is performed by projecting through a fiducial mark on the reticle or mask onto a substrate coated with a calibration material such as a photochromic material where the substrate is positioned on the substrate holder, i.e., the translation stage. (A photochromic material is one which undergoes a change of at least 5 percent in absorption or a change of 0.01 in refractive index when exposed to the calibration light at a light intensity that does not induce unacceptable mechanical degradation of the photochromic material.) The fiducial mark in the mask or reticle is designed to produce a pattern in the calibration material that is capable of inducing sufficient diffraction. Two beams of light having essentially the same phase and having essentially the same polarizations are intersected at a glancing angle over the projected fiducial mark. (The glancing angle generally avoids interference with the lens system.) The relative phase and/or path length of the intersecting beams are adjusted to produce an interference pattern above the diffraction grating and an interaction of this interference pattern with the diffraction grating that produces a diffracted light intensity quantifiable by the detection electronics, e.g., an observable extremum, in the resulting beams of diffracted light. The position of the calibration diffraction grating yielding this reference diffracted light intensity corresponds to the position desired for an equivalent diffraction grating fiducial mask on the substrate to be processed.

After calibration, alignment is achieved by placing the substrate to be processed with its overlying photosensitive material and its diffraction grating fiducial marks onto the translation stage of the exposure tool. The substrate position is determined using, for example, conventional expedients such as the global alignment tool of the exposure apparatus. The stage is then proximately positioned for exposure. The fiducial mark on the substrate (corresponding to the fiduial mark on the reticle or mask) is then aligned by observing, as a function of stage position, the intensity behavior of the diffracted light intensity induced by the interaction between the previously adjusted intersecting beams and the fiducial diffraction pattern--the desired alignment position corresponding to the position yielding the reference diffracted light intensity. In this manner, alignment relies on the initial calibration utilizing the exposing wavelength through the exposing lens system and the subsequent optical observation during the final alignment in the exposure position. The desired criteria for accurate registration are achieved and excellent reliability is attained. Additionally, even without the calibration technique, improvement over many alignment systems is still obtained using the intersecting beam approach.

DETAILED DESCRIPTION

Figure 1:
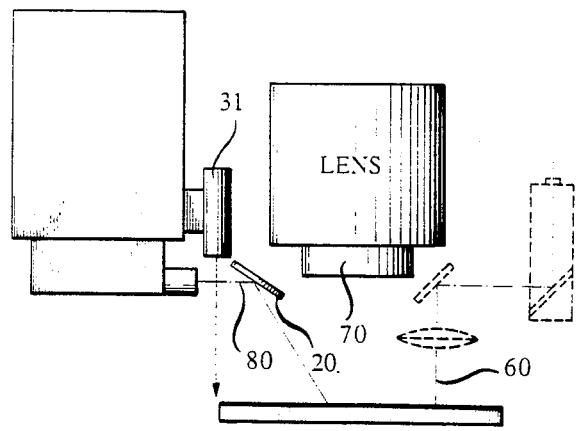
FIGS. 1 and 2 illustrate apparatuses involved in the invention.

Although for pedagogic reasons the invention is described in terms of a deep ultraviolet exposure system, the invention is not limited to this spectral range. Indeed the invention is suitable for any exposure system including those utilizing X-ray, ion, and electron exposing radiation.

A. Initial Calibration

Calibration is performed by using a diffracting pattern, e.g., grating pattern, fiducial mark on the reticle or mask. (Generally, but not necessarily, a fiducial mark for x direction positioning and a separate one forr y direction positioning together with separate alignment systems for each is employed. However, the lines of the grating need not be parallel to these directions.) This fiducial mark should be in a pattern that produces a diffraction grating having a period that is equal to, or an integral multiple of, the period of the fringes produced by the intersecting beams. Small deviations from integral multiples is acceptable and do not produce substantial error. Generally, the larger the number of fringes in the grating, the smaller the deviation allowed to maintain the same error level. If the number of fringes is the same, larger gratings require smaller deviation. However, the number of fringes has a substantially larger effect on error than grating size. Typically, it is desirable to have a fractional deviation less than 1/2N where N is the number of fringes. (If a reticle is utilized where the reticle is proportionally bigger than the image ultimately projected, the period of the mark on the reticle should be such that the projected image has the desired diffraction grating spacing.)

The exposed material utilized for making the calibration is not critical provided a diffraction pattern corresponding to the projected image and having a resolution of at least half of the grating period is produced upon exposure without the necessity of moving the wafer from the translation stage for development. It has been found that photochromic materials such as 1,3,3 trimethylindoino-6'-Nitrobenzopyrylo spiran intermixed in polymers such as poly(methyl methacrylate) at concentrations in the range 20 to 80 percent are suitable. The exposing radiation should produce a difference in refractive index between lines and spaces in the calibration material of at least 0.01 and/or a change in absorption of at least 5 percent. The calibration material, e.g., the photochromic material, is subjected to the exposing wavelength through the reticle (or mask) and through the lens imaging system ultimately to be utilized in the lithographic process. (This calibration technique of using a material that undergoes a discernible optical change without movement of the calibration material off the translation stage before calibration with this optical change is advantageously employed in alignment schemes even without the subsequently described intersecting beam calibration and alignment techniques. For example a calibration vernier is projected onto the calibration material. The vernier is then moved under a global alignment microscope redicule and the calibration correction determined from the known distance moved and the known position of the global alignment redicule.)

Figure 3:
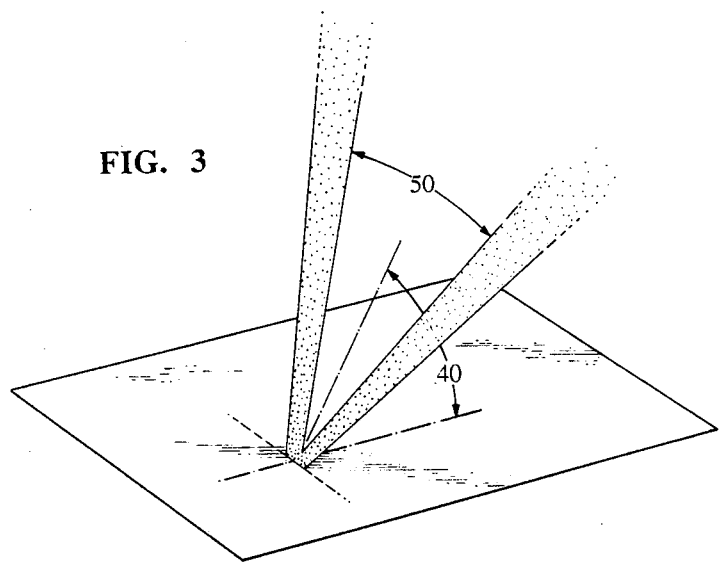
FIG. 3 is illustrative of optical configurations involved in the invention.

Two beams are directed to intersect above the calibration diffraction pattern produced in the calibration material. (If the calibration material undergoes a permanent or temporary refractive index or absorption change, the exposing radiation need not be maintained once the grating is formed.) It is possible to control the position of intersection (i.e., move the aligning light to the mark, not the mark to the aligning light as in most site-by-site aligners) by conventional techniques such as moving the incoming beam along the direction y (or vertical) in FIG. 1 and/or by moving the prism, 13, along the direction x (or horizontal). The intersecting beams are brought in at the shallow angle denoted 40 in FIG. 3. By utilizing a glancing angle, it is possible to make the light incident on the calibration material and avoid interference with lens 70 of the imaging system. The angle relative to the substrate thus, should generally be sufficiently low so that the beams do not substantially impact the lens system. However, angles less than approximately 5 degrees induce substantially increased reflection at the calibration surface, and thus, although not precluded, are less advantageous. Generally, an incident angle of between 5 and 25 degrees is employed. (In some lens systems it is not possible to introduce the light below the lens system. However, advantage is still possible by calibrating and aligning outside the lens system using intersecting beams in the previously-described site-by-site approach. It is even possible to do this type alignment in the exposure position. For example, the alignment marks on the substrate are sufficiently spatially removed from the corresponding portion to be exposed that they are beyond the exposure lens system when this portion is in the exposure position.) Additionally, if an exposure lens is not employed, such as in electron beam exposure, or if alignment is done outside the lens, angles up to and including 90 degrees are acceptable.

It is generally desirable for the intersecting light to be in the wavelength range 500 to 1100 nm. For example, a 6328 Angstrom line from a HeNe laser is employed. Light in this wavelength range is employed generally since below 5000 Angstroms the resist material utilized in the subsequent alignment step typically is exposed by the radiation. Generally, the intersecting beams should have power at the alignment surface of at least 1 microwatt. Powers less than 1 microwatt lead to excessive noise. For stability, the path lengths of the two intersecting beams should be generally relatively close, e.g., should be within 5 cm for HeNe light. However, for thermal stability of the system it is advantageous to have the path lengths as close as possible. This is accomplished, for example, by obtaining the two beams from a single laser beam that has been split by conventional optics such as polarizing beam splitters, dielectric or metallized beam splitters. Additionally, the relative angle between the two beams, 50 in FIG. 3 should be in the range 5 to 30 preferably 10 to 15. Larger angles lead to the loss of higher order diffraction from the underlying calibration pattern, and thus, limit the region in which detection is possible. Smaller angles form large fringe periods and result in a degradation of accuracy. Thus, although not precluded for this reason, lower angles are less desirable. Exemplary of suitable conditions is the angle of 13.36 degrees between the beams and 20 degrees between a beam and the substrate for a 3 $\mu$m period and HeNe laser light.

Figure 2:
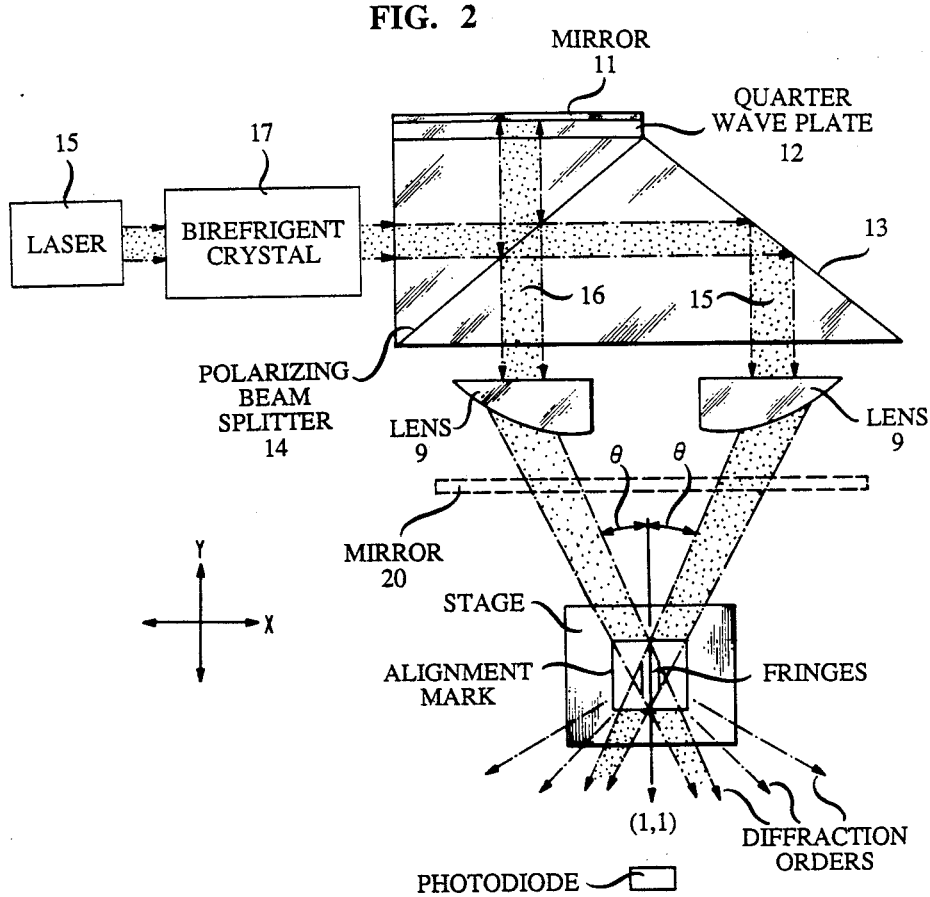

The intersecting beams above the calibration surface produce an interference pattern including light and dark lines denominated fringes. The size and period of this pattern is adjusted by changing the angle between the two beams. The size of the pattern and the period should be chosen to yield more than 10 lines in the grating to maintain accuracy. The size of the pattern on the wafer is typically in the range 50 to 200 $\mu$m. Patterns larger than 200 $\mu$m occupy excessive wafer space. The period is typically in the range 2 to 8 $\mu$m. The interference pattern interacts with the diffraction grating produced in the calibration material. It is generally desirable to adjust the beams so that the resulting interference pattern fills the entire diffraction grating, although partial filling of the grating is not precluded. The interaction of the interference pattern with the grating produces a series of diffraction orders as shown in FIG. 2. Generally, the (1,1), i.e., the first order of diffraction, is monitored because it is symetric and only one, not two, photodiodes need be used with the concomitant simplification in signal processing. However, it is possible to obtain accurate results by monitoring any pair of the observable diffraction orders. The relative phase of the intersecting beams is adjusted through expedients such as changing the angle of a glass plate, and/or moving a mirror, or electrooptic crystals, until a reference intensity, e.g., extremum, is observed in the diffraction order being monitored. This reference intensity denotes the appropriate positioning of any fiducial mark on the substrate relative to the corresponding fiducial mark of the reticle or mask.

B. Alignment

The calibrating substrate is removed and the substrate to be processed is placed on the translation stage substrate holder. The substrate is moved into approximate alignment. This proximate alignment is accomplished by determining the position of the wafer holder by the conventional global alignment utilizing interferometric techniques, and moving the substrate holder stage by, for example, interferometry to the approximate alignment position. The diffraction gratings in the substrate corresponding to the fiducial mark of the reticle or mask is subjected to the same intersecting beams as adjusted in the calibrating procedure. (If diffraction grating calibration is not performed, the parameters previously described for use in the calibration are used in the alignment.) These intersecting beams upon interaction with the diffraction gratings fiducial mark in the substrate produces diffraction orders similar to those obtained during the calibration procedure. The position of the substrate is then adjusted to again obtain the reference diffraction intensity, and thus, to accurately align the fiducial mark of the substrate with the fiducial mark of the mask or reticle. If a plurality of exposures are to be made, it is possible to repeat the alignment procedure for each alignment mark.

In a preferred technique the monitoring system includes a photodetector such as silicon photodiode and processing electronics that detect an error signal such as boxcar integrators, phase sensitive detection, and tuned amplifiers. (The difference between the photodetector signal and the reference signal is detected and the resulting error signal is fed back to the exposure tool which moves the substrate to minimize the error signal.) It has also been found convenient to move the optical fringes in a reciprocating pattern around the approximate alignment position. The resulting diffraction order yields an intensity variation. By using this reciprocal movement and electronics such as boxcar integration, phase sensitive detection, and tuned amplifiers, errors are reduced by averaging. Nevertheless, such reciprocal movement is not required.

The following examples are illustrative of conditions useful in the inventive process.

EXAMPLE 1

The alignment system was physically attached to the global alignment structure of a GCA DSW- Wafer Stepper 4800 stepper. The optics for introducing the intersecting beams at the substrate in the exposure position is shown in FIG. 2. The HeNe laser (663 nm), 15, had a power output of approximately 2 milliwatts. The laser position around an axis along its long direction was adjusted so that the emanating light had a polarization plane that was approximately 45 degrees to the major surface of the substrate. The beam was directed through a quartz birefringent crystal. The birefringent crystal was X-cut and was positioned so that small rotations of the crystal produced corresponding small oscillations in the difference of phase between the horizontal and vertical components of the laser light. The system also included (1) a polarizing beam splitter, 14, that reflected the horizontal polarized component of the light and (2) a quarter wave plate, 12, with a mirror, 11. The quarter wave plate and the mirror were chosen so that the horizontal light entering the quarter wave plate was reflected from the mirror, again transversed the quarter wave plate, and exited as vertically polarized light. Two lenses, 9, having a focal length of approximately 70 millimeters were positioned to reduce the beams, 15 and 16, from a diameter of approximately 1 millimeter to a diameter of approximately 0.2 millimeters at the substrate surface. The lenses were positioned so that the angle $\theta$ between the two beams was approximately 6.05 degrees. Additionally, a mirror shown in phantom, 20, in FIG. 1 and in FIG. 2 was inserted so that the beams were reflected towards the substrate and made an angle of approximately 20 degrees relative to the substrate. Seven silicon photodiodes with a photosensitive area of approximately 3 millimeters diameter was positioned to detect the various orders of diffracted light produced during substrate calibration and alignment. Their positioning was accomplished with a controlled sample.

The controlling electronics includes a boxcar integrator that compared a square wave signal utilized to oscillate the birefringent crystal to the ac component of the signal from the photodiode of the order being utilized for alignment. The output of this integrator was a dc error signal that was proportional to the error in the ac component. Electronics were further provided for feeding this error signal back to the positioning electronics of the stepper. The stepper translation stage under the influence of this feedback was moved to yield a minimum in the ac component of the photodiode output. Electronics was also provided so that when the alignment was measured by the amplitude of the error signal was beter than 0.1 micrometers exposure by the stepper was automatically triggered.

Calibration of the Apparatus

A reference wafer was produced by applying a few drops of a solution containing 80 percent of 1,3,3 trimethylindoino-6'-nitrobenzopyrylo spiran, 20 percent of poly(methyl methacrylate) and then dissolved at a 1:10 ratio in a solvent. The wafer was spun at the rate of about 3000 rpm to yield a final photochromic layer thickness of 1 $\mu$m. The wafer with the photochromic side exposed was placed on the sample holder of the stepper. The wafer was positioned by the automatic handling system of the stepper. A 6-inch (5:1) quartz reticle approximately 0.040 inch in thickness was positioned in the reticle holder of the apparatus. This reticle included a series of electrically probable test patterns similar to those described in *VLSI Elelctronics*, N. Einspruch, ed., p. 320, Academic Press, 1987, a series of spatially distributed optical verniers, and an alignment mark that measured 1.5 millimeter square and had a period of approximately 30 micrometers. The reticle was positioned utilizing alignment marks for that purpose on its holder by observation through an optical microscope. The sample was moved so that the photochromic surface was in the exposure position. The photochromic material was then exposed through the reticle using the mercury discharge exposure lamp (405 nanometers). The exposure was maintained for approximately 5 seconds at an intensity of several hundred milliwatts per square centimeter. After exposure, the intersecting beams of the alignment optics utilizing the equipment shown in FIG. 2 was directed along path 80 to intersect at the resulting diffraction grating in the sample. (The intersection point of the beams had previously been adjusted to be positioned at the point of exposure for the alignment mark.) The feedback electronics from the boxcar integrator to the stepper electronics was disconnected. The dc bias to the birefringent crystal was adjusted to yield a minimum in the ac output of the photodiode monitoring the central diffraction order. The photochromic sample wafer was then removed.

A 4-inch wafer was then used to test the alignment system. This wafer included a 3500 Angstrom thick overlying layer of silicon dioxide covering the entire surface, and an overlying layer of tantalum silicide of thickness 2500 Angstroms having (1) the pattern of the first level of the electrically probeable test pattern, (2) the corresponding optical vernier marks, and (3) the diffraction grating alignment marks. (Tantalum silicide was chosen because of its advantageous electrical properties for electrical probeable testing.) A tri-level resist was utilized over the tantalum silicide layer. This resist included a 1.1 $\mu$m thickness layer of novolac mmaterial overlaid by a 0.12 $\mu$m thick layer of silicon dioxide which, in turn, was overlaid by a 0.6 $\mu$m thick layer of Shipley #1822 positive photoresist.

The sample wafer was positioned on the translation stage of the stepper utilizing the automatic wafer handler. A global alignment was performed with the global alignment optics, 31, supplied with the GCA stepper. After global alignment the wafer was moved to the approximate position for the first exposure. The feedback loop between the boxcar integrator and the stepper was connected. The electronics was allowed to align the wafer by minimizing the ac signal and upon suitable alignment to perform the first exposure. The alignment system was maintained during the entire exposure. The electronics for alignment was then disconnected and the stepper was allowed to approximately position the wafer for the next exposure. The alignment procedure and exposure was then repeated. A series of exposures on the same wafer was also done utilizing global alignment but not the intersecting beam alignment technique. The sample was then removed from the stepper, developed, and processed by conventional techniques.

The misalignment for the various exposures was measured as described in Einspruch, supra. The best results for the site-by-site techniques showed a standard deviation of error consistently around 0.3 μm and showed an error as good as 0.003 μm. The globally aligned samples although at times showing equivalent error had a very large standard deviation and poor consistency.

For some exposed samples for a given reticle it was found that a constant error was obtained. To correct for this error after calibration the dc bias of the birefringent crystal was adjusted. This one-time adjustment was found to be necessary generally when the machine was completely reconfigured or for like changes in exposure conditions.

EXAMPLE 2

The procedure of Example 1 was followed except the alignment electronics was turned off during exposure of the same and a constant signal was maintained on the translation stage.

I claim:

1. A method for fabricating a device formed from a device substrate, said substrate including an alignment mark and a radiation sensitive material comprising the steps of (1) positioning said substate for lithographic exposure by employing said alignment mark, (2) exposing said substrate to said radiation through a mask or reticle and through a focussing means to delineate a pattern in said radiation sensitive material, and (3) progressing towards the completion of said device by employing said delineated pattern characterized in that said alignment mark is capable of diffracting light and said alignment is accomplished by (A) intersecting at least two beams of said light at said mark wherein said intersecting beams and said alignment mark are such that an interference pattern is formed that is diffracted from said mark and such that siad beams are directed to avoid passing through said focussing means and (B) positioning said substrate based on an optical characteristic of said diffracted light.

2. The method of claim 1 wherein said substrate comprises a semiconductor substrate.

3. The method of claim 1 wherein said radiation comprises deep ultraviolet radiation.

4. The method of claim 3 wherein said exposure is performed without movement of said substrate after alignment.

5. The method of claim 4 wherein said light comprises radiation in the spectral range from 500 to 1100 nm.

6. The method of claim 4 wherein said optical characteristic comprises the intensity of said diffracted light.

7. The method of claim 1 wherein said exposure is performed without movement of said substrate after alignment.

8. The method of claim 7 wherein said light comprises radiation or the spectral range from 500 to 1100 nm.

9. The method of claim 1 wherein said light comprises radiation in the spectral range from 500 to 1100 nm.

10. The method of claim 1 wherein said optical characteristic comprises the intensity of said diffracted light.

11. The method of claim 1 including the steps of (1) calibrating said alignment by performing said exposure on a calibrating material to produce a pattern comprising a diffraction grating projected from said reticle or mask that corresponds to said mark included in said substrate, (2) adjusting the properties of said light to obtain a reference optical characteristic of said diffracted light, and (3) performing said positioning for said alignment by reproducing said reference optical characteristic.

12. The method of claim 11 wherein said radiation comprises deep ultraviolet radiation.

13. The method of claim 12 wherein said exposure is performed without movement of said substrate after alignment.

14. The method of claim 11 wherein said exposure is performed without movement of the substrate after alignment.

15. The method of claim 13 wherein said light comprises radiation in the spectral rays from 500 to 1100 nm.

16. The method of claim 11 wherein said optical characteristic comprises the intensity of said diffracted light.

17. A method for fabricating a device formed from a device substrate, said substrate including an alignment mark and a radiation sensitive material comprising the steps of (1) positioning said substrate for lithographic exposure by employing said alignment mark, (2) exposing said substrate to said radiation through a mask or reticle to delineate a pattern in said radiation sensitive material, and (3) progressing towards the completion of said device by employing said delineated pattern characterized in that said alignment is calibrated by performing a calibration exposure on a calibrating material that undergoes an observable optical change without a procedure requiring movement of the said calibrating material of the means used for said positioning of said exposure.

18. The method of claim 17 wherein said calibrating material comprises a photochromic material.

19. The method of claim 17 wherein said optical change produces a diffraction grating.

20. The method of claim 19 wherein said diffraction grating diffracts light from intersecting beams.

* * * * *